(12) United States Patent
Fontecha et al.

(10) Patent No.: US 6,515,354 B1
(45) Date of Patent: Feb. 4, 2003

(54) MICRO-BGA BEAM LEAD CONNECTION WITH CANTILEVERED BEAM LEADS

(75) Inventors: Edwin R. Fontecha, San Jose, CA (US); Viswanath Valluri, Sunnyvale, CA (US); Valerie Vivares, Palo Alto, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/643,848

(22) Filed: Aug. 23, 2000

Related U.S. Application Data
(60) Provisional application No. 60/214,367, filed on Jun. 28, 2000.

(51) Int. Cl.[7] .............................................. H01L 23/495
(52) U.S. Cl. ..................... 257/670; 257/680; 257/773; 257/774; 257/775
(58) Field of Search ................................ 257/670, 680, 257/774, 773, 775, 776

(56) References Cited

U.S. PATENT DOCUMENTS

| | | | | |
|---|---|---|---|---|
| 5,994,222 A | * | 11/1999 | Smith et al. ................... 216/14 |
| 6,043,559 A | * | 3/2000 | Banerjee ...................... 257/700 |
| 6,054,756 A | * | 4/2000 | DiStefano et al. ........... 257/668 |
| 6,081,035 A | * | 6/2000 | Warner et al. ............... 257/773 |
| 6,268,646 B1 | * | 7/2001 | Sugimoto ..................... 257/673 |
| 6,300,670 B1 | * | 10/2001 | Kramer ........................ 257/621 |
| 6,355,975 B2 | * | 3/2002 | Miyazaki et al. ............ 257/668 |

FOREIGN PATENT DOCUMENTS

JP    406151679 A   *  5/1994

* cited by examiner

*Primary Examiner*—Olik Chaudhuri
*Assistant Examiner*—Nathan W. Ha

(57) ABSTRACT

A tape automated bonding (TAB) tape is provided with an insulating tape having a die receiving section. The TAB tape also has a conductive wiring pattern forming a plurality of traces including a land at one end and a beam lead at another end. A tape window is formed in a portion of the tape die receiving section. At least one trace beam lead extends over the tape window from a first direction and is connected to a tie bar adjacent an opposing side of the tape window and at least one trace beam lead extends over the tape window from a second direction different than the first direction and is cantilevered over the tape window.

7 Claims, 6 Drawing Sheets

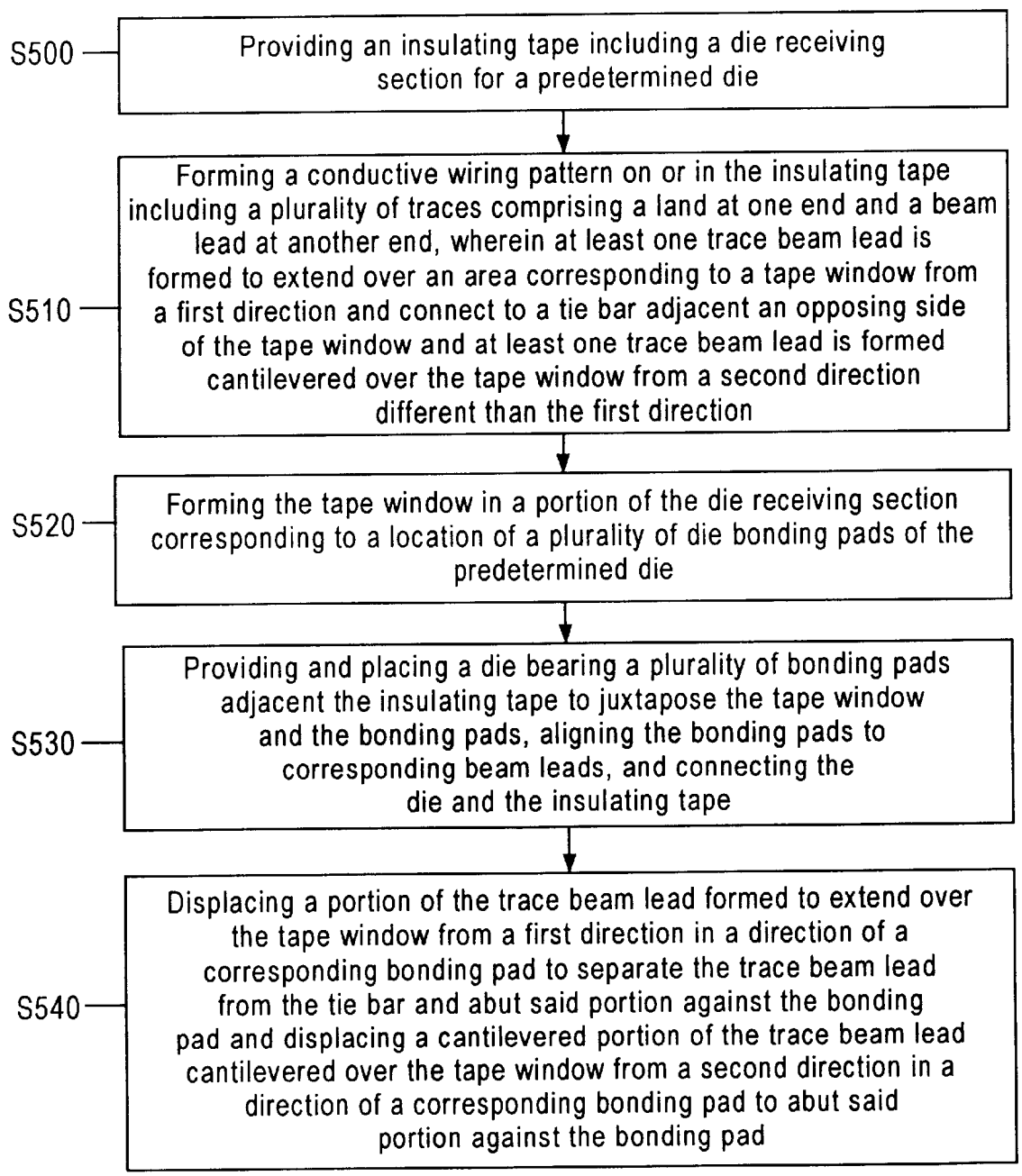

MICRO-BGA BEAM LEAD CONNECTION WITH CANTILEVERED BEAM LEADS

This application claims priority from U.S. Provisional Application Serial No. 60/214,367, filed Jun. 28, 2000, incorporated herein by reference.

FIELD OF THE INVENTION

The present invention relates to integrated circuit packages, and more particularly to an integrated circuit package having beam leads approaching die bonding pads from more than one direction.

BACKGROUND ART

Semiconductor chips or wafers are used in applications including integrated circuits (ICs) or flash memory, which may be used in portable electronic devices. It is desirable that a semiconductor chip hold as many circuits or memory cells as possible per unit area to minimize the size, weight, and energy consumption of devices using the semiconductor chips. ICs, whether individual active devices, individual passive devices, multiple active devices within a single chip, or multiple active and passive devices within a single chip, require suitable input/output (I/O) connections between themselves and other circuit elements or structures. These semiconductor devices are typically small and fragile and commonly carried on substrates or carrier members for support. These devices are also frequently encapsulated to protect the device from unfavorable environments, such as dust, mechanical or electrical loads, and moisture.

As the density of semiconductor chip integrated circuits increases, the density of I/O terminals, such as contacts and leads must also increase through, for example, smaller contacts and leads and/or different I/O configurations. Chip-scale packages (CSPs) offer one advantageously compact geometry, requiring a package having dimensions no more than 1.2 times the dimensions of die 10. CSPs find particular applicability in portable devices such as pagers, camcorders, cell phones, cameras, personal information managers, laptop computers, and global positioning devices, where size and weight are important considerations. Of these chip-scale packages, one increasingly important high density I/O configuration is a micro-ball grid array ($\mu$BGA) package. FIGS. 1 and 2 illustrate a chip-scale $\mu$BGA package.

FIG. 1 shows a cross-section of the $\mu$BGA package including a die 10, an elastomer or epoxy-based thermoset adhesive 20 applied to a lower surface of die 10, and a tape or sheetlike interposer 30, such as an insulating organic film of polyimide. The tape 30 has an adhesive 25 formed on one side and also has metal traces or wirings 40 formed thereon or embedded therein. The metal traces 40 are made, for example, by forming a thin metallic film on the tape 30 such as by evaporation or deposition and wet-etching the metallic film. At one end, each of the metal traces 40 is attached to a respective die bonding pad 60. The traces 40 are routed across tape 30, as shown in FIG. 2, to terminate in a conductive land 45. The lands 45 collectively form a matrix pattern and vias or holes 50 are formed in the tape 30 to overlie these lands 45. As shown in FIG. 1, conductive balls 65 such as solder balls are formed in vias 50 to contact lands 45 and permit electrical connection of the I/O terminals or bonding pads 60 of the die 10 to corresponding bonding pads disposed on the surface of a printed circuit board (PCB) or other substrate. The pitch, a distance from a center line of one ball to a center line of an adjacent ball, is designated by P. An encapsulant 80, such as an epoxy thermoset, is provided to protect the electrical connections from damage caused by unfavorable environments, such as described above.

As shown in FIG. 2, tape windows 70 are selectively formed at either end of die 10 in areas corresponding to the die I/O bonding pads 60. Subsequent to connection of tape 30 to die 10, traces 40 are connected to bonding pads 60. One approach to connecting trace 40 and bonding pad 60 is "wire bonding", wherein a separate wire is used to connect a bonding pad provided at an end portion of trace 40 to bonding pad 60. The separate wire is bonded to each of the bonding pads by bonding means including ultrasonic bonding, thermal bonding, and compression bonding. Another approach to connection of traces 40 and bonding pads 60 which is better suited for the particular design constraints of $\mu$BGA and limitations of conventional manufacturing equipment, is a "beam lead" connection illustrated by FIGS. 1 and 2. The beam lead connection is achieved by forming a portion 55 of each trace 40 to project into tape window 50 and overlie a position to be occupied by a bonding pad 60. When a die 10 is disposed in a die receiving area 15 of tape 30, the bonding pads 60 are exposed within the tape window 50 and are displaced (e.g., vertically) from a projecting portion 55 of a corresponding trace 40. The projecting portion 55 is mechanically deformed (e.g., vertically) to contact a bonding pad 60, where it is bonded to the bonding pad 60 by conventional bonding techniques and tools, such as an ultrasonic wedge bonder, to form a beam lead connection.

FIG. 3 illustrates a non-linear distribution of die bonding pads 60 wherein two groupings of bonding pads are disposed substantially perpendicular to one another. As with the previous example, a portion 55 of each trace 40 projects into tape window 50 to overlie a bonding pad 60. Portions 55 span a width of the tape window 50 or project into the tape window from the side and terminate in a tie bar or beam lead support 75. The tie bar 75 is typically a ganged support common to a plurality of beam leads. To form an electrical connection between the portion 55, or beam lead, to the die 10 bonding pad 60, the portion 55 is mechanically deformed to contact a respective bonding pad 60. This deformation and bonding may be achieved by conventional bonding techniques and tools, such as an ultrasonic wedge bonder, thermode, or thermosonic bonder to form the beam lead connection. Portions 55 may have a notch adjacent tie bar 75 to facilitate separation of the beam lead 55 from the tie bar 75 during formation of the electrical contact.

However, despite its advantages, $\mu$BGA packaging is not as robust as conventional packaging and die evolution to increasingly smaller die sizes, particularly to CSPs, imposes additional constraints on design, manufacture and reliability of the die packaging. One important parameter is the bending profile of the beam lead, the exposed portion of the trace 40 extending into the tape window 70 to contact the die 10 bonding pad 60. If the bending profile, such as the radius of curvature of the points of beam inflection, is too severe hairline cracks may develop and lead to device failure. Conventionally, to ensure that the beam lead bending profile is maintained, a predetermined tape window 70 size or width is kept constant and a predetermined beam length is maintained.

Dies may be designed with a non-linear distribution of bonding pads. For example, bonding pads 60 may be distributed around a corner of the die 10, as shown in FIG. 3. In such a case, beam leads 55 may be required to approach the die bonding pads from more than one direction. Conventionally, a tie bar or beam lead support 75 is formed to support and maintain the beam lead protruding portions 55 above a corresponding bonding pad 60 until they are separated from the tie bar during the bonding operation. However, μBGA design rules require both a minimum space S between pads on adjacent sides of about 0.2 mm and require a minimum beam lead length L of about 0.9 mm, although the actual requirement may vary. These requirements, combined with the conventional reliance on a tie bar or beam lead support to preserve alignment of the beam leads during packaging and the requisite tolerances necessary to ensure that the beam lead support will not inadvertently short circuit a beam lead adjacent and parallel thereto, sacrifice valuable die and packaging space.

SUMMARY OF INVENTION

Accordingly, a need exists in the art for an improved ball grid array package that avoids a potential for short circuit due to beam lead support placement and provides additional flexibility in bonding pad and beam lead placement.

This and other needs are met by the invention which provides, in one aspect, a tape automated bonding (TAB) tape including an insulating tape having a die receiving section and a conductive wiring pattern forming a plurality of traces including a land at one end and a beam lead at another end. A tape window is formed in a portion of the tape die receiving section. At least one trace beam lead extends over the tape window from a first direction and is connected to a tie bar adjacent an opposing side of the tape window and at least one trace beam lead extends over the tape window from a second direction different than the first direction and is cantilevered over the tape window.

Another aspect of the invention is a method for manufacturing a semiconductor package. This method includes providing an insulating tape including a die receiving section for a predetermined die and forming a conductive wiring pattern on or in the insulating tape, including a plurality of traces comprising a land at one end and a beam lead at another end. A tape window is formed in a portion of the die receiving section corresponding to a location of a plurality of die bonding pads of the predetermined die. At least one trace beam lead is formed to extend over the tape window from a first direction and connect to a tie bar adjacent an opposing side of the tape window and at least one trace beam lead is formed cantilevered over the tape window from a second direction different than the first direction.

Included within the above aspect of the invention are additional steps of providing the predetermined die bearing a plurality of bonding pads, placing the predetermined die and the insulating tape adjacent one another to juxtapose the tape widow and the bonding pads and align the bonding pads to corresponding beam leads. A portion of the trace beam lead formed to extend over the tape window from a first direction in displaced in a direction of a corresponding bonding pad to separate the trace beam lead from the tie bar and abut said portion against the bonding pad, where they are electrically connected and a cantilevered portion of the trace beam lead cantilevered over the tape window from a second direction is displaced in a direction of a corresponding bonding pad to abut said portion against the bonding pad, where they are electrically connected.

Additional features and advantages of the invention will become readily apparent to those skilled in the art from the following detailed description, wherein only several embodiments or applications of the invention are shown and described, simply by way of illustration of best modes contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

FIG. 6 is a flow chart illustrating a method for manufacturing a semiconductor package according to the invention.

DESCRIPTION OF THE INVENTION

The present invention addresses and solves problems related to μBGA short circuit caused by improper beam lead support placement and provides additional flexibility in bonding pad and beam lead placement.

Figure 4:
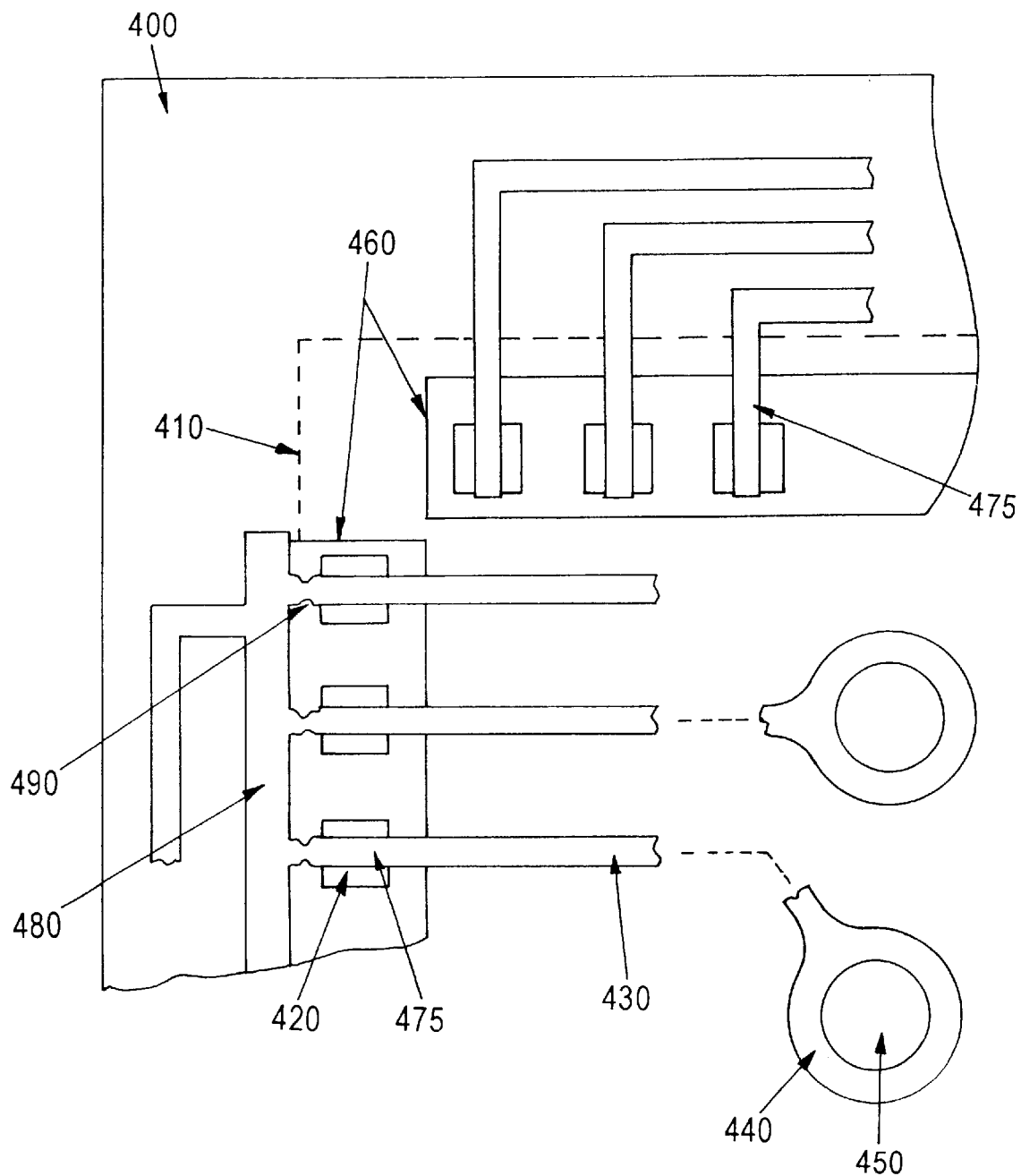
FIG. 4 is a top view of a tape automated bonding tape oriented adjacent a die and including cantilevered beam leads.
Figure 5A:
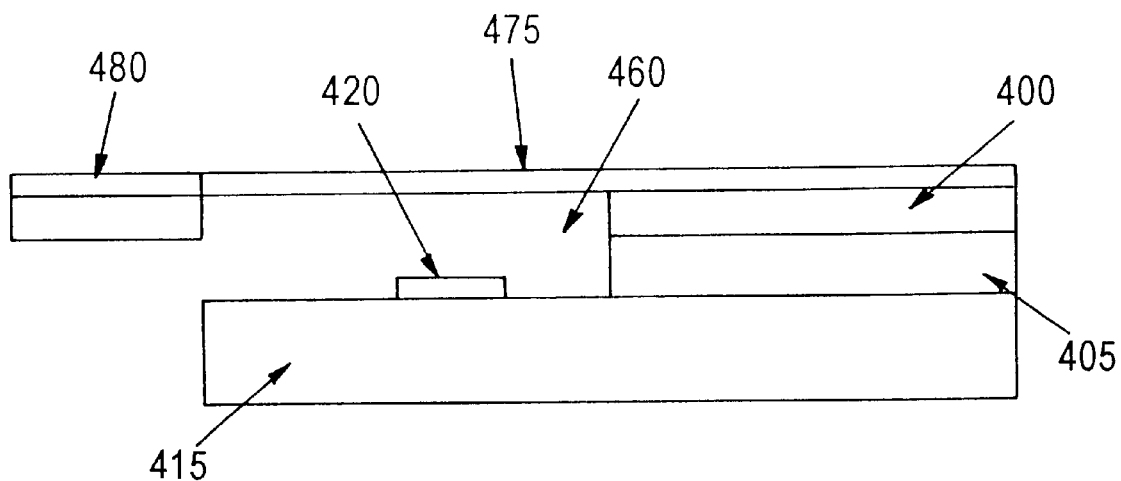
FIGS. 5a and 5b are cross-sectional views of FIG. 4 showing the beam leads (FIG. 5a) and cantilevered beam leads (FIG. 5b) according to the invention.
Figure 5B:
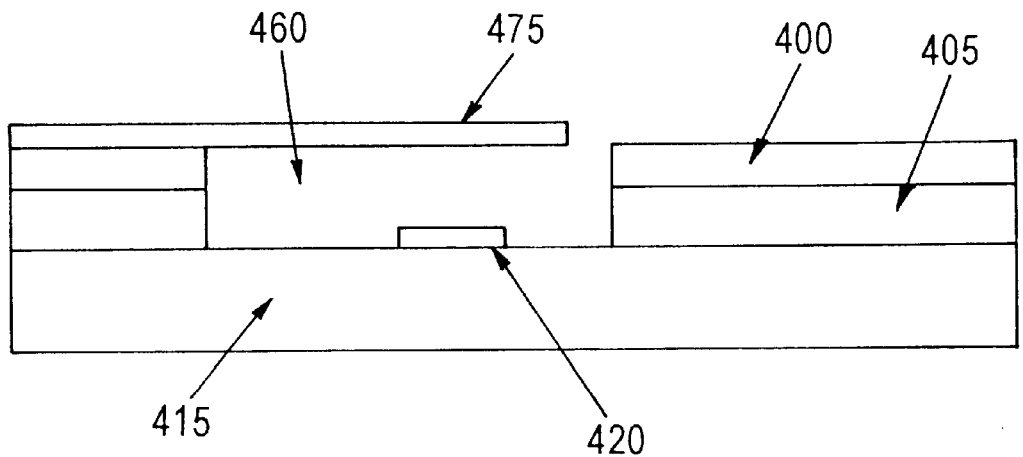

FIG. 4 depicts a top view of a tape automated bonding (TAB) tape according to the invention and FIGS. 5a and 5b show illustrative cross-sections thereof. The TAB tape 400 includes a die receiving section 410 for receiving a die 415, such as a FLASH memory die or other form of semiconductor chip, possessing a plurality of bonding pads 420 on a side of die opposing the tape 400. The tape 400 is connected to this die 415 by conventional connecting agents, such as adhesives, which are preferably used in combination with a compliant elastomer 405, such as an epoxy thermoset, disposed between the tape 400 and die 415, as shown in FIG. 5b. The elastomer provides a buffer against thermal and mechanical stresses and strains caused by varying coefficients of thermal expansion between the tape 400 and die 415.

Figure 1:
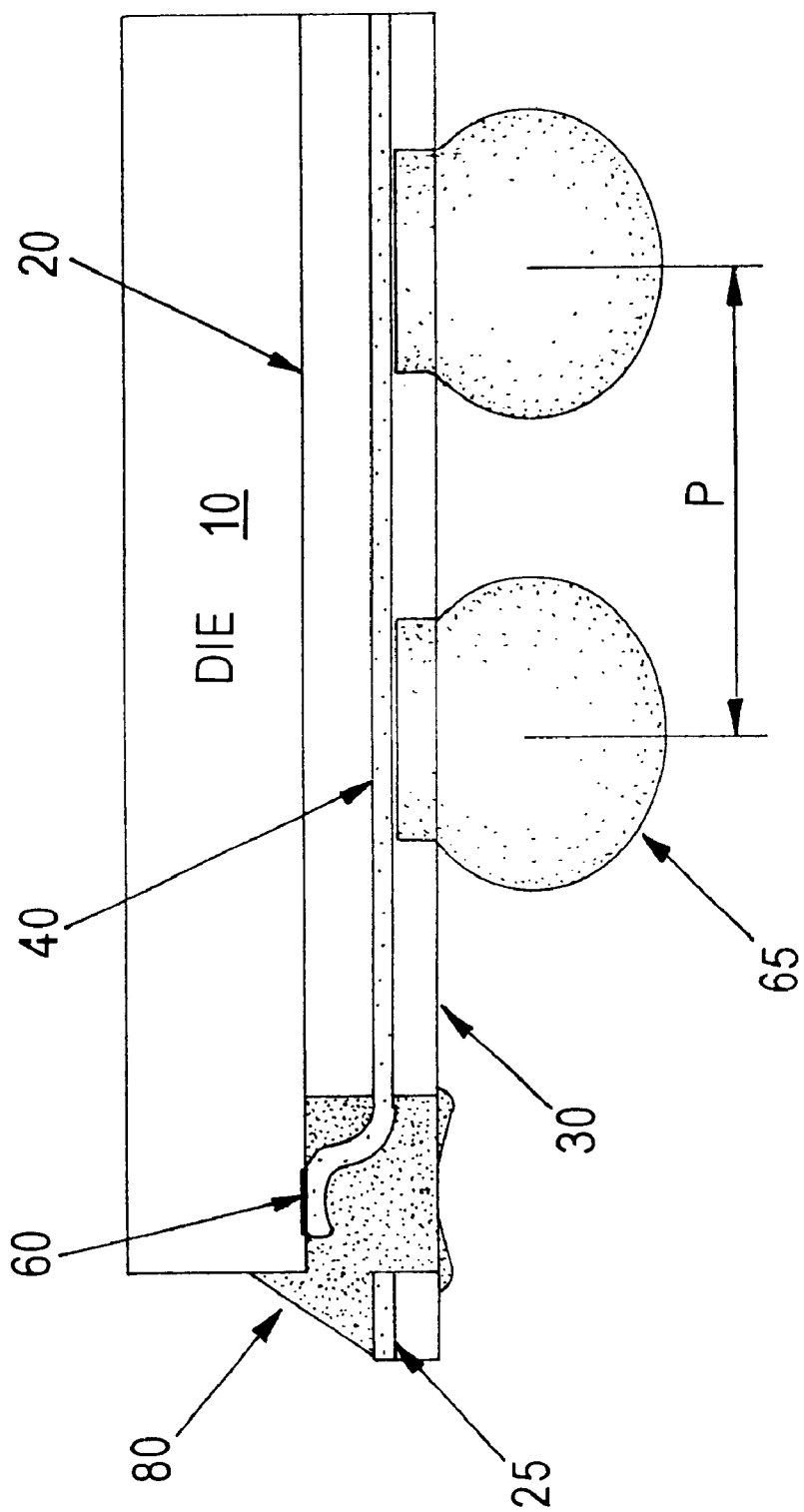
FIG. 1 is a side view of a micro-ball grid array (μBGA) package.
Figure 2:
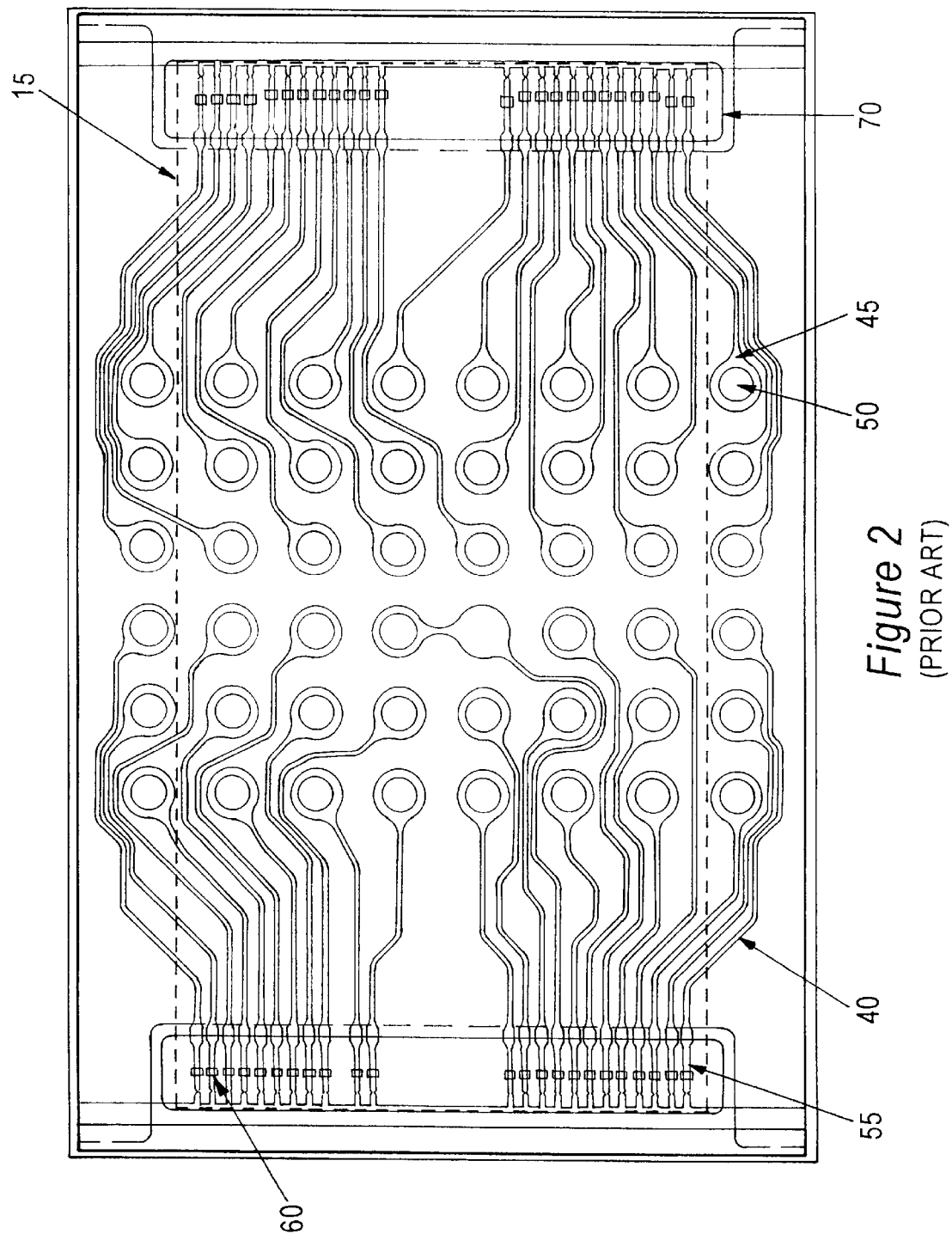
FIG. 2 is a top view of a micro-ball grid array (μBGA) package.

Tape 400 is typically an organic high-modulus insulating film or tape, such as a polyimide film or other thermoset polymer commonly used in tape automated bonding (TAB). Examples of suitable tape 400 include Kapton H™, Kapton V™ (both manufactured by DuPont), or a glass epoxy tape. Alternatively, the film may comprise a laminated structure including outer layers of a polyimide film or other thermoset polymer. It is preferred that the total thickness of the film be about 40-60 μm. Tape 400 is rectangular or square in shape, often having a shape corresponding to that of a die and often being slightly larger than a die to provide, for example, additional space for routing of conductive traces 430 formed on or in the tape to collectively form a wiring pattern. Tape windows or openings 460 are formed in the tape die receiving section at positions corresponding to positions of the die bonding pads 420 to permit connection of conductive elements 430 formed on or in the tape to these pads. In a preferred μBGA embodiment, tape window 460 has a width W between approximately 0.7 mm to 0.9 mm Conductive traces 430 may be formed on tape 400 by depositing a thin metallic film, such as copper, on the tape and etching the metallic film. The present invention also encompasses multiple levels of wiring in or on multiple sides of tape 400. Each of the conductive or wire traces 430 has a land 440 at one end. This land 440 is an enlarged, often substantially circular, conductive pattern having a diameter slightly larger than a corresponding via 450 to be etched or formed thereover. The vias 450 nominally have a diameter of between about 0.25 to 0.375 mm. Thus, the lands 440 must have at least a diameter accommodating the via 450 diameter and any possible via positioning tolerances. Thus, the lands may range from approximately 0.30 to 0.50 mm, depending on via size, equipment and process tolerances, and other design considerations known to those skilled in the art. The lands 440 and vias 450 form a matrix, such as shown in FIG. 2, which may assume a variety of distributions or clusters having a pitch between about 0.40 to 0.80 mm for a $\mu$BGA structure.

Figure 3:
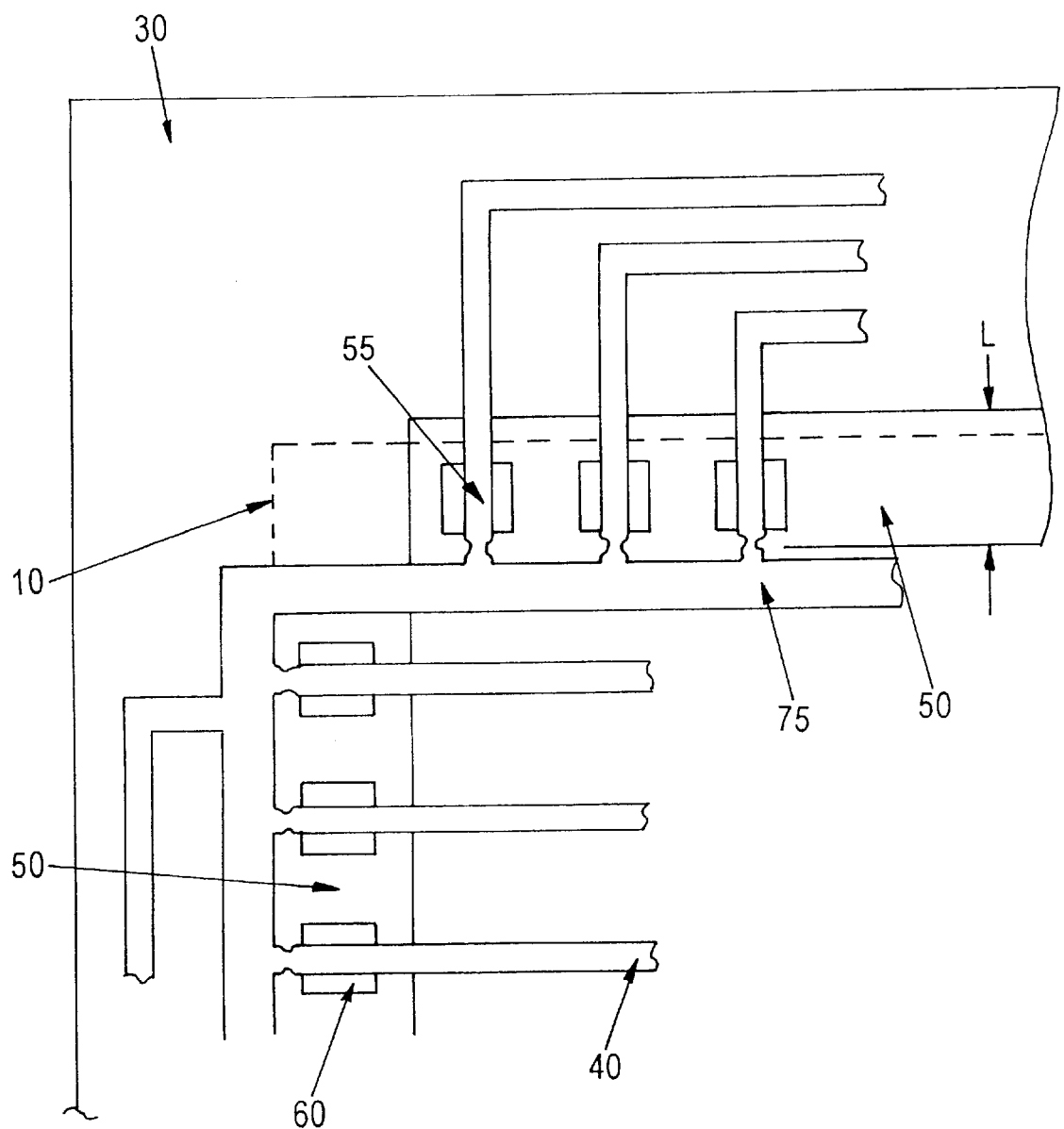
FIG. 3 is a top view of a conventional micro-ball grid array interconnection scheme employing beam leads and tie bars.

From lands 440, the traces 430 are routed along or within tape 400 and are routed around other traces 430, lands 440 and vias 450 to terminate in the vicinity of tape windows 460. In the conventional $\mu$BGA beam lead configuration, as noted in the Background of the Invention and as illustrated in FIG. 3, a portion of each trace projects into the tape window to overlie a bonding pad wherein the portions extend in or across the tape window and are connected to a tie bar or beam lead support. This beam lead configuration is illustrated in FIG. 5a. Thus, similar to the conventional art, the present invention includes a wiring pattern comprising a plurality of traces 430 having lands 440 at one end and beam leads 475 at another end, wherein the beam leads extend over the tape window 460 from a first direction and are connected to a tie bar 480 adjacent an opposing side of the tape window. However, in contrast to the conventional art, the present invention includes one or more cantilevered beam leads 475 extending over the tape window from a second direction different than the first direction. In other words, the beam leads 475 extend unsupported, at one end, over the tape window 460. This cantilevered beam lead configuration is illustrated in FIG. 5b, illustrating the beam lead position prior to connection with a respective bonding pad. In one embodiment, the first direction is substantially perpendicular to the second direction, although the combination of beam leads connected to beam lead supports or ties bars and cantilevered beam leads is equally application to other angles and orientations.

The invention also includes, as shown in FIG. 6, a method for manufacturing a semiconductor package including providing, in step S500, a TAB tape 400 including a die receiving section 410, as generally described above. In step S510, a conductive wiring pattern is formed on or in the tape 400. As known to those skilled in the art, formation of the wiring pattern may be accomplished by depositing a polyimide adhesive layer and then forming, such as by vapor deposition, a copper thin film thereon which is then selectively removed, such as by conventional photoetching techniques using etchants such as cupric chloride or ferric chloride. This wiring pattern includes traces 430 comprising a land 440 at one end and a beam lead 475 at another end. At least one of these beam leads 430 is formed to extend over an area corresponding to a tape window 460 (formed in step S520) from a first direction to connect to a tie bar 480 adjacent an opposing side of the tape window and at least one beam lead 475 is formed to be cantilevered over the tape window 460 from a second direction different than the first direction.

Exposed portions of the tape 400 (e.g., sections where the copper film was etched to expose the tape) may then be selectively etched in step S520 using an etchant such as a hydrazine-alkali aqueous solution to form one or more tape windows 460. Tape windows 460 are formed in a portion of the die receiving section 410 corresponding to a location, upon assembly, of die bonding pads 420.

The method for manufacturing a semiconductor package also includes in step S530, providing a die of predetermined dimensions bearing a plurality of bonding pads 420 and placing the die and the insulating tape adjacent one another to juxtapose the tape widow and the bonding pads so that the bonding pads 420 are aligned with corresponding beam leads 475. This die could include, for example, an AMD™ LV160 or 320 die. An elastomer or epoxy thermoset adhesive is provided between the die and the insulating tape to adhesively connect the die and the insulating tape.

Step S530 includes displacing a portion of the trace beam lead 475 formed to extend over the tape window 460 from a first direction in a direction of (i.e., toward) a corresponding bonding pad 420 to separate the trace beam lead 475 from the tie bar or beam support structure 480 and abut the separated end of the beam lead against the bonding pad, where the separated end portion and the bonding pad are bonded together to form an electrical connection. Likewise, step S530 includes displacing a cantilevered portion of the trace beam lead 475 cantilevered over tape window 460 from a second direction in a direction of a corresponding bonding pad to an end portion of the cantilevered beam lead against the bonding pad. As shown in FIG. 4, the beam leads 475 are preferably formed with notches 490 to facilitate separation of the beam lead end portion from the tie bar 480. The beam lead deformation and bonding are effected by, for example, an ultrasonic wedge bonder, thermode, or thermosonic bonder.

Further steps in the method of the invention include, in step S540, forming a plurality of vias 450 concentric with the lands 440 of the traces. The diameter of the vias 450 is preferably between about 0.25 mm and 0.33 mm for $\mu$BGA applications. The vias are then filled the vias with an electrically conductive material to electrically connect the vias with lands of the traces. The electrically conductive material can include conductive balls comprising Sn, such as 63/37, 60/40, or 90/10 PbSn. The diameter of the conductive balls is preferably between approximately 0.30 mm and 0.35 mm. The electrically conductive material can also include, for example, conductive polymers or resins and other electrically conductive compositions and materials. Finally, the method includes depositing any of the various types of encapsulants known to those in the art, such as an epoxy thermoset, over at least the tape window 460 and beam lead 475 to bonding pad 420 connections. The conductive balls may be used to electrically connect the semiconductor package to, for example, a printed circuit board (PCB).

Thus, the present invention addresses and solves problems related to $\mu$BGA short circuit caused by improper beam lead support placement and provides additional flexibility in bonding pad and beam lead placement, while preserving the predetermined window size and predetermined beam lead length.

Only several embodiments of the invention are shown to illustrate its versatility as shown and described in the present disclosure. As will be realized, the invention is capable of other and different embodiments, and its several details are capable of modifications in various obvious respects, all without departing from the invention and the drawings and description are to be regarded as illustrative in nature. Accordingly, the present invention is not limited by the specific aspects presented and described herein and is instead defined by the claims.

What is claimed is:

1. A tape automated bonding (TAB) tape, comprising:

an insulating tape including a die receiving section;

a conductive wiring pattern including a plurality of traces comprising a land at one end and a beam lead at another end; and a tape window formed in a portion of the tape die receiving section, wherein at least one trace beam lead extends over the tape window from a first direction and is connected to a tie bar adjacent an opposing side of the tape window, and wherein at least one trace beam lead extends over the tape window from a second direction different than the first direction and is cantilevered over the tape window.

2. A TAB tape according to claim 1, wherein a plurality of trace beam leads extend over the tape window from a first direction and are connected to a tie bar, and wherein a plurality of trace beam leads extend over the tape window from a second direction different than the first direction and are cantilevered over the tape window.

3. A TAB tape according to claim 2, wherein the first direction is substantially perpendicular to the second direction.

4. A TAB tape according to claim 2, further comprising:

a plurality of tape windows;

wherein at least one trace beam lead extends over each of the plurality of tape windows from a first direction and is connected to a tie bar adjacent an opposing side of the tape window, and wherein at least one trace beam lead extends over each of the plurality of tape windows from a second direction different than the first direction and is cantilevered over the tape window.

5. A TAB tape according to claim 2, wherein the insulating tape comprises polyimide.

6. A TAB tape according to claim 2, wherein the lands of a plurality of traces are disposed in a matrix pattern.

7. A tape automated bonding (TAB) tape according to claim 1, wherein a beam lead support is not provided adjacent a portion of the tape window opposite to the cantilevered trace beam lead.

* * * * *